United States Patent [19]

Denda et al.

[11] Patent Number: 4,524,374

[45] Date of Patent: Jun. 18, 1985

[54] DEVICE FOR DETECTING INFRARED RAYS

[75] Inventors: Masahiko Denda; Natsuro Tsubouchi, both of Hyogo, Japan

[73] Assignee: Mitsubishi Denki K.K., Tokyo, Japan

[21] Appl. No.: 285,243

[22] Filed: Jul. 20, 1981

[30] Foreign Application Priority Data

Jul. 22, 1980 [JP] Japan ................................. 55-100929

[51] Int. Cl.³ ............................................. H01L 27/14
[52] U.S. Cl. ........................................ 357/15; 357/30; 357/35
[58] Field of Search ............. 357/15 M, 15 R, 15 LA, 357/30 C, 24 LR, 38 LA, 38 C, 38 T, 34, 30, 15, 35; 307/317 A

[56] References Cited

U.S. PATENT DOCUMENTS 3,971,057  7/1976  Connors et al. ................... 357/91 X
4,015,283  3/1977  Hayashi et al. ........................ 357/15

OTHER PUBLICATIONS

Wood, R. A., "Schottky Barrier Alloy-Junction Guard Ring" *IBM Tech. Disclosure Bull.*, vol. 12, No. 7, p. 1057, Dec. 1969.

*Primary Examiner*—Martin H. Edlow
*Attorney, Agent, or Firm*—Sughrue, Mion, Zinn, Macpeak & Seas

[57] ABSTRACT

A device for detecting infrared rays and a method for manufacturing the same having an improved sensitivity in the infrared range. A first region of a second conductivity type is formed on a substrate of a first conductivity type by diffusion or ion-implantation. Second and third regions of the same conductivity type as the substrate are formed in the first region and the substrate by diffusion or ion-implantation. A metal such as platinum, gold or palladium is evaporated onto an exposed part of the first region by sputtering. The metal layer thus deposited is annealed to form a Schottky contact.

5 Claims, 1 Drawing Figure

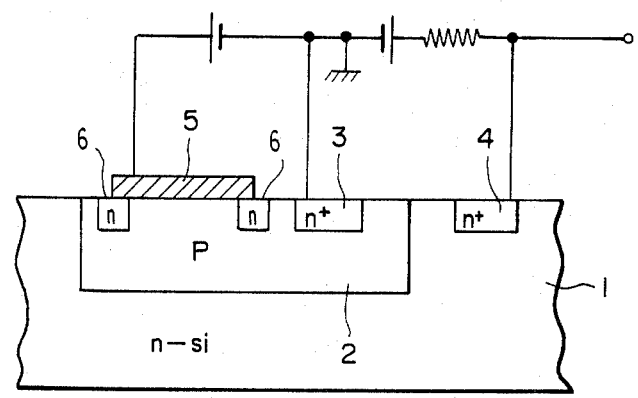

DEVICE FOR DETECTING INFRARED RAYS

BACKGROUND OF THE INVENTION

The present invention relates to a device for detecting infrared rays.

Conventionally, such a device has employed a Schottky silicon type, a silicon impurity doped type, or a compound semiconductor type structure, and the like. Each of these devices has certain disadvantages.

The Schottky silicon type, if used as a photocell, provides a uniform sensitivity and the produciton thereof is easy due to its use of a silicon substrate. However, the device has a narrow sensing range for the incident light and the signal output thereof is low. The silicon impurity doped type has a wide sensing range and the signal output thereof is high, but the production of the substrate therefor is more difficult than for the silicon Schottky type. The compound semiconductor type has a wide sensing range, but the production of the crystal substrate thereof is also more difficult than the Schottky silicon type. Moreover, the leakage current thereof is very large.

A structure such as a silicon Schottky type, in comparison with the other structures, is most suitable for use in a monolithic circuit such as a "CCD" (charged couple device) in a two-dimensional array. However, the greatest disadvantage of this device is a lower sensitivity in detecting infrared rays.

Conventional structures of the Schottky silicon type device, for example, are composed of a metal such as platinum silicide (Pt-Si) or gold (Au) evaporated onto a surface of a P type silicon substrate having a specific resistance of about 10 Ω-cm. Schottky junctions formed between the metal and the P type silicon substrate can be used for detecting infrared rays.

Usually, the barrier height between Pt-Si and P type silicon is 0.275 eV, and that between Au and P-type silicon is 0.25 ev. The detectable wavelength, based on quantum mechanics, calculated from these barrier values is 4.47 μm in the case of Pt-Si and 4.92 μm in the case of Au. Therefore, the ratio of detecting sensitivity D is usually about $10^9$ cm $Hz^{\frac{1}{2}}W^{-1}$, that is, this value is 1 to 2 orders of magnitude lower compared to that obtainable with other more desirable methods. More specifically, the ratio of detecting sensitivity D (or D*) is defined by $$D^* \equiv \sqrt{\Delta f} \cdot \sqrt{Ad} \cdot R/Vn$$

wherein f is an amplifier bandwidth (Hz), Ad is a detector area (cm$^2$), R is a sensitivity represented in volts per watt (V/W). For the two-dimensional array of the Schottky junction, $\Delta f=3$ Hz, $Ad=3\times10^{-5}$ cm$^2$, $R=1\times10^9$ V/W, and $Vn=5$ mV, resulting in a ratio of detecting sensitivity D* $1.9\times10^9$ cmHz$^{\frac{1}{2}}$/W.

SUMMARY OF THE INVENTION

A primary object of the present invention is to provide an improved structure of a Schottky type detecting device for infrared rays.

Overcoming the above noted defects, the invention provides a novel device for detecting infrared rays including a first conductivity type semiconductor substrate and a first region of a second conductivity type formed on the substrate. A Schottky junction is formed on the first region and a second region of the first conductivity type formed on the first region. An output is derived from the substrate by irradiating infrared rays onto the Schottky junction.

According to the present invention, the detecting sensitivity for infrared rays is increased about 100 times over that of the conventional device.

BRIEF DESCRIPTION OF THE DRAWINGS

The single accompanying FIGURE shows a cross-sectional view of an infrared semiconductor device according to the present invention.

DESCRIPTION OF THE PREFERRED EMBODIMENTS

A preferred embodiment according to the present invention will be described with reference to the accompanying drawings.

In the FIGURE, numeral 1 designates a N type silicon substrate, 2 a P type impurity region, 3 an N+ impurity region, 4 an N+ impurity region, and 5 a platinum silicon (Pt-Si) layer.

The structure as shown in the drawings will be obtained as follows.

A P type region 2 having a surface impurity density of $10^{17}$ atms/cc is formed by diffusion or ion-implantation on a <100> axis silicon substrate having an N type phosphorous impurity density of $10^{15}$ atms/cc. Further, N+ impurity regions 3 and 4 each having a surface impurity density of $10^{20}$ atms/cc are formed by the same method thereon. The processes used are substantially the same as used for manufacturing an NPN transistor.

In the FIGURE, a region 1 designates a collector, 2 is a base, 3 is an emitter, 4 is a collector contact, respectively, corresponding to the NPN transistor.

Further, in order to form a Schottky contact, platinum is deposited by sputtering on an exposed part of the region 2. Thereafter, a Schottky contact between the Pt-Si layer 5 and the P type silicon region 2 is formed by annealing in a nitrogen atmosphere at a temperature of approximately 600° C. After that, a contact made of metal such as aluminum is formed on each part of the regions 3, 4 and 5 by a conventional technique. The contact is used as a lead electrode (not shown). If necessary, a N− type guard layer 6 may be formed around the Schottky contact of the Pt-Si layer 5 to improve the contact characteristics thereof.

The operation of the device thus constructed will be described.

The device according to the present invention is used at a low temperature, for instance 77° K. With the Pt-Si layer 5 biased with a positive voltage of about 5 volts with respect to the region 3, a reverse bias is applied to the Schottky junction while a forward bias is applied to a junction between the regions 2 and 3. In this state, no current flows except a leakage current between regions 3 and 5 due to the reverse biasing of the Schottky junction. If infrared rays are applied to the Pt-Si layer 5, the energy of the infrared rays is absorbed within the Pt-Si layer 5 resulting in generation of positive holes. Subsequently, the positive holes are injected into the region 2 after passing through the Schottky barrier between the Pt-Si layer 5 and the region 2. As a result, electrons as minority carriers are injected from the region 3 into the region 2 simultaneously with the injection of holes as minority carriers from the region 2 into the region 3. Thereafter, the minority carrier electrons arrive at the substrate 1. In this structure, if the region 3 is operated as an emitter and the region 2 as a base D, a current amplification factor of approximately $h_{FE}=10^2$ is provided, if the junction depth between the region 2 and the region 3 is properly set. At that time, an injected detecting current from the Pt-Si layer 5 to the region 2 generated by infrared irradiation rays is outputted from the region 4, multiplied effectively by $h_{FE}$.

With the structure described above, the detecting sensivitity is effectively increased 100 times over that of the conventional device.

According to the present invention, the detection sensitivity of the Schottky type detector for the infrared rays is effectively greatly increased. Furthermore, conventional techniques for producing a silicon semiconductor device are available for producing the device of the invention. Therefore, forming a monolithic circuit using this device together with a "CCD" is very easy compared to previously known techniques using a semiconductor compound. Hitherto, a fundamental structure has been described. If this device is formed as part of an integrated circuit, an epitaxial layer is formed on a p-type substrate and each device is separated electrically by forming an oxide layer therebetween. Then, an N region corresponding to the substrate 1 is formed.

In the embodiment described, a metal such as Pt-Si is used in forming the Schottky junction. However, other metals such as gold or palladium are applicable similarly with the present invention.

What is claimed is:

1. A device for detecting infrared rays comprising:
   a first conductivity type semiconductor substrate;
   a first region of a second conductivity type formed on said substrate;
   a metal material formed on said first region to form a Schottky junction between said metal material and said first region;
   a second region of said first conductivity type formed on said first region to form a P-N junction between said first and second regions;
   bias means for reverse biasing said Schottky junction and thereby forward biasing said P-N junction upon infrared irradiation of said Schottky junction; and
   output means for producing an output from said substrate upon irradiation of said Schottky junction with infrared rays.

2. The device for detecting infrared rays of claim 1 wherein said Schottky junction comprises an annealed layer of platinum silicide.

3. The device for detecting infrared rays of claim 1 further comprising a guard layer formed around said Schottky junction.

4. A device for detecting infrared rays as claimed in claim 1, wherein said bias means comprises means for applying a potential between said metal material and said second region.

5. A device for detecting infrared rays as claimed in claim 1, wherein said metal material contacts only said first region without contacting said substrate or second region.

* * * * *